United States Patent
Eitoh et al.

(10) Patent No.: US 7,498,611 B2
(45) Date of Patent: Mar. 3, 2009

(54) TRANSPARENT ELECTRODE FOR SEMICONDUCTOR LIGHT-EMITTING DEVICE

(75) Inventors: Nobuo Eitoh, Ichihara (JP); Noritaka Muraki, Ichihara (JP); Hisayuki Miki, Ichihara (JP); Munetaka Watanabe, Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 11/659,360

(22) PCT Filed: Jul. 27, 2005

(86) PCT No.: PCT/JP2005/014137

§ 371 (c)(1),
(2), (4) Date: May 23, 2007

(87) PCT Pub. No.: WO2006/013867

PCT Pub. Date: Feb. 9, 2006

(65) Prior Publication Data

US 2008/0042159 A1     Feb. 21, 2008

Related U.S. Application Data

(60) Provisional application No. 60/602,648, filed on Aug. 19, 2004.

(30) Foreign Application Priority Data

Aug. 5, 2004   (JP)   ............... 2004-228968

(51) Int. Cl.
*H01L 33/00* (2006.01)

(52) U.S. Cl. .................. 257/99; 257/103; 257/E33.064

(58) Field of Classification Search .................. 257/99, 257/E33.064
See application file for complete search history.

(56) References Cited

U.S. PATENT DOCUMENTS

| | | | | |
|---|---|---|---|---|
| 5,309,001 | A * | 5/1994 | Watanabe et al. | 257/99 |
| 6,316,792 | B1 * | 11/2001 | Okazaki et al. | 257/99 |
| 6,693,352 | B1 * | 2/2004 | Huang et al. | 257/743 |
| 2001/0022367 | A1 * | 9/2001 | Nakamura et al. | 257/99 |
| 2004/0124422 | A1 * | 7/2004 | Sakamoto et al. | 257/79 |
| 2005/0263779 | A1 * | 12/2005 | Hon et al. | 257/94 |
| 2006/0175682 | A1 * | 8/2006 | Muraki et al. | 257/613 |
| 2007/0200129 | A1 * | 8/2007 | Watanabe et al. | 257/99 |
| 2007/0243414 | A1 * | 10/2007 | Miki | 428/699 |

FOREIGN PATENT DOCUMENTS

| | | |
|---|---|---|
| JP | 7-94782 | 4/1995 |
| JP | 2804742 | 7/1998 |
| JP | 11-340506 A | 12/1999 |
| JP | 2000-188421 A | 7/2000 |
| JP | 2002-313749 A | 10/2002 |

* cited by examiner

*Primary Examiner*—Tu-Tu V Ho
(74) *Attorney, Agent, or Firm*—Sughrue Mion, PLLC

(57) ABSTRACT

A transparent electrode for a gallium nitride-based compound semiconductor light-emitting device includes a p-type semiconductor layer (5), a contact metal layer (1) formed by ohmic contact on the p-type semiconductor layer, an current diffusion layer (12) formed on the contact metal layer and having a lower magnitude of resistivity on the plane of the transparent electrode than the contact metal, and a bonding pad (13) formed on the current diffusion layer. The transparent electrode is at an advantage in widening the surface of light emission in the p-type semiconductor layer, decreasing the operation voltage in the forward direction, and enabling the bonding pad to provide excellent adhesive strength.

20 Claims, 4 Drawing Sheets

TRANSPARENT ELECTRODE FOR SEMICONDUCTOR LIGHT-EMITTING DEVICE

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/602,648 filed Aug. 19, 2004 and Japanese Application No. 2004-228968 filed Aug. 5, 2004 pursuant to 35 U.S.C §111 (b).

TECHNICAL FIELD

This invention relates to a transparent electrode and more particularly to a transparent electrode possessing excellent transparent property and ohmic property suitable for a gallium nitride-based compound semiconductor light-emitting device.

BACKGROUND ART

In recent years, the GaN-based compound semiconductor materials have been attracting attention as semiconductor materials for use in the short wavelength light-emitting devices. The GaN-based compound semiconductors are formed on sapphire single crystals and various oxides and Group III-V compounds as substrates by the metal organic chemical vapor deposition method (MOCVD method), the molecular beam epitaxy method (MBE method), etc.

The GaN-based compound semiconductor materials have a characteristic feature of inducing small current diffusion in the lateral direction. Though the cause for this phenomenon has not been elucidated in detail, it may be probably ascribed to the presence of numerous dislocations threading the epitaxial crystal from the substrate through the first surface. Further, the p-type GaN compound semiconductor has high specific resistance as compared with the n-type GaN compound semiconductor and is not hardly enabled by simply stacking metal on the first surface to add to the lateral expanse of electric current in the p-layer and, when fabricated in an LED configuration having a p-n junction, is enabled to emit light only directly below the positive electrode.

Thus, it is common to use a transparent electrode as the p-electrode. For example, the idea of stacking Ni and Au on a p-layer and subjecting the stacked metals to an alloying treatment and consequently promoting decrease of the resistance of the p-layer and forming a positive electrode with transparent property and ohmic property, has been proposed (refer, for example, to Japanese Patent No. 2804742).

For the purpose of acquiring bonding strength in the pad electrode, a structure which is enabled, by cutting off a portion of a transparent electrode and forming a pad electrode throughout on the transparent electrode and a straddle the cut-off portion, to acquire the bonding strength in the part directly contiguous to the GaN layer and at the same time attain current diffusion in the part contiguous to the transparent electrode, has been laid open to public inspection (refer, for example, to JP-A HEI 7-94782).

Because a given metal ideally acquires ohmic contact, it does not necessarily follow that this metal shows a high mechanical-contact-strength. When a bonding pad is allowed to contact a semiconductor layer, the contact entails the problem that the part of this contact inevitably gives rise to an increase in the contact resistance and consequently suffers the forward voltage ($V_F$) to rise.

In short, the bonding pad is effective in lowering the operation voltage in the forward direction when the area of contact which it produces with the semiconductor layer is decreased.

This invention has for an object the provision of a transparent electrode for a gallium nitride-based compound semiconductor light-emitting device, which transparent electrode produces excellent ohmic contact and current diffusion and abounds in contact strength of bonding pad as well. The term "transparent property" as used in this invention means that the pertinent electrode is transparent to the light of a wavelength in the range of 300 to 600 nm.

DISCLOSURE OF THE INVENTION

This invention provides a transparent electrode for a gallium nitride-based compound semiconductor light-emitting device, comprising a p-type semiconductor layer, a contact metal layer formed by ohmic contact on the p-type semiconductor layer, a current diffusion layer formed on the contact metal layer and possessing a lower value of resistivity on a plane of the transparent electrode than the contact metal layer, and a bonding pad formed on the current diffusion layer.

In the transparent electrode, the bonding pad has an area of 90% or more held in contact with the current diffusion layer.

The transparent electrode is formed solely of a metal. It can contain a layer of an electroconductive oxide.

In the transparent electrode, the bonding pad has an area of contact with the p-type semiconductor layer that is 10% or less. It can avoid contacting the p-type semiconductor layer.

The current diffusion layer has an uppermost layer covered with a layer formed of a metal.

The contact metal layer is formed of a platinum group metal. The contact metal layer can be limited to that formed of platinum. The contact metal layer has a thickness in the range of 0.1 to 7.5 nm, preferably 5 nm or less, more preferably in the range of 0.5 to 2.5 nm.

The current diffusion layer is formed of a metal selected from the group consisting of gold, silver and copper or an alloy containing at least one of these. The current diffusion layer can be limited to that formed of gold. The current diffusion layer has a thickness in the range of 1 to 20 nm, preferably 10 nm or less, more preferably in the range of 3 to 6 nm.

The bonding pad contains a first layer contacting the current diffusion layer, and the first layer contains a layer containing at least one metal selected from the group consisting of Ti, Al, Au and Cr or an alloy thereof. The first layer of the bonding pad has a thickness in the range of 20 to 3000 nm. The bonding pad can have a second layer formed on the first layer, and the second layer contains a layer formed of at least one metal selected from Ti, Cr and an alloy thereof. The second layer of the bonding pad has a thickness in the range of 20 to 3000 nm. The bonding pad has an uppermost layer formed of Au.

The present invention also provides a light-emitting device which uses the transparent electrode.

The transparent electrode of this invention has a p-type semiconductor layer, a contact metal layer formed on the p-type semiconductor layer, a current diffusion layer formed on the contact metal layer and a bonding pad formed on the current diffusion layer. The contact metal layer is formed of a material possessing transparent property and acquiring excellent ohmic contact. The current diffusion layer is formed of a material possessing a lower magnitude of resistivity on the plane of the transparent electrode than the contact metal layer. The bonding pad is formed of a material giving rise to fast adhesion to the current diffusion layer. Therefore, the configuration obtained will bring an effect of enlarging the light-emitting plane in the semiconductor layer, decreasing the operation voltage in the forward direction and providing the bonding pad with excellent adhesive strength.

The above and other objects, characteristic features and advantages of the present invention will become apparent from the description made herein below with reference to the accompanying drawings.

BEST MODE FOR CARRYING OUT THE INVENTION

The transparent electrode of this invention is made of a structure resulting from stacking a contact metal layer, a current diffusion layer and a bonding pad. It will be described below with reference to the accompanying drawings.

Figure 1:
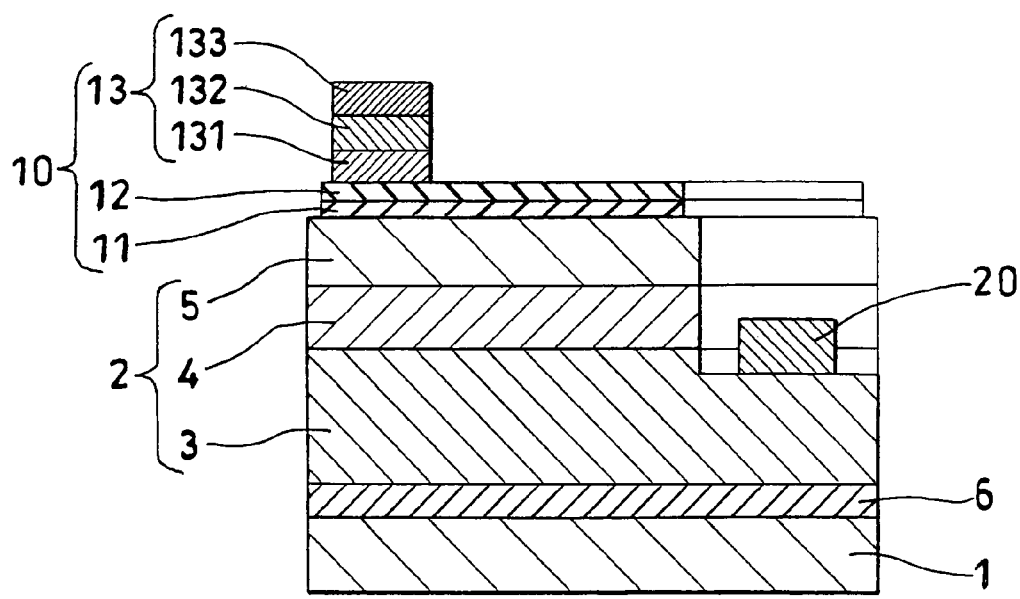
FIG. 1 is a schematic view illustrating the cross section of a light-emitting device provided with a transparent electrode of this invention.

FIG. 1 is a schematic view illustrating the cross section of a light-emitting device furnished with a transparent electrode of this invention. In FIG. 1, reference numeral 11 denotes a contact metal layer, numeral 12 an current diffusion layer and numeral 13 a bonding pad layer that comprises three layers of a first layer 131, a second layer 132 and a third layer 133. The layers 11 to 13 jointly form a transparent electrode 10 of this invention. Though the bonding pad layer is depicted to be composed of three layers in FIG. 1, it may be composed of more than three layers. Reference numeral 1 denotes a substrate, numeral 2 a GaN-based compound semiconductor layer which is composed of an n-type semiconductor layer 3, a light-emitting layer 4 and a p-type semiconductor layer 5. Reference numeral 6 denotes a buffer layer and numeral 20 a negative electrode.

As depicted in FIG. 1, the bonding pad has the whole lower surface thereof contact the current diffusion layer and not contacting the semiconductor layer.

For the purpose of acquiring the effect of lowering the operation voltage in the forward direction as aimed at by this invention, it is necessary that the bonding pad have preferably 90% or more, more preferably 95% or more, most preferably the whole (100%), of the area of the lower surface thereof contact the current diffusion layer.

The bonding pad layer which forms the bonding part has been known in various structures using various kinds of material. Any of these known bonding pads may be adopted herein without any particular restriction.

The lowermost layer 131 of the bonding pad will be called a first layer. The first layer preferably uses a material which shows an excellent adhesive property to the current diffusion layer. Particularly preferably, it contains at least one metal selected from among Ti, Al, Au and Cr or an alloy thereof. The metal to be contained therein is more preferably Au or Cr and most preferably Au.

The first layer of the bonding pad preferably has a thickness in the range of 20 to 3000 nm. If the first layer is unduly thin, it will fail to acquire an effect of thorough adhesion. If it is unduly thick, it will fail to give rise to any particular advantage but will elongate the time for the process and incur waste of material. It is normally advantageous to avoid any deviation from the range specified above. The thickness is more preferably in the range of 50 to 1000 nm and most preferably in the range of 100 to 500 nm.

The second layer 132 which is formed on the first layer of the bonding pad plays the role of enhancing the strength of the whole bonding pad. It is, therefore, necessary to use a comparatively strong metallic material or increase the film thickness sufficiently. Ti and Cr are preferred materials therefor. Particularly, Ti proves favorable in terms of the strength of material. This layer preferably has a thickness in the range of 20 to 3000 nm. This layer fails to acquire satisfactory strength when it is unduly thin or produce any particular advantage when it is unduly thick. The thickness is more preferably in the range of 50 to 1000 nm and most preferably in the range of 100 to 500 nm The third layer 133 (the outermost layer) of the bonding pad is preferably made of a material which shows an excellent adhesiveness to a bonding electrode. The bonding electrode uses gold more frequently than not. Au and Al are known to be the metals which show excellent adhesiveness to the gold electrode. In the two metals, gold proves particularly advantageous.

The transparent electrode may have all component layers thereof formed invariably of metals and may include layers of oxides among them. When the current diffusion layer has a structure which includes a layer formed of an oxide, the oxide layer may be so constructed as to have the surface thereof covered with a thin metal layer for the purpose of increasing the mechanical adhesive strength between the bonding pad and the current diffusion layer.

The bonding pad is preferably formed of a plurality of layers. For the purpose of formation thereof, any of the known methods, such as the sputtering method and the vapor deposition method, may be adopted. The plurality of layers forming the bonding pad may be stacked invariably by the same method or by methods changed halfway in the total of component layers. From the viewpoint of the adhesiveness between the adjoining layers, however, it is preferable to have all the component layers stacked in the same chamber without allowing any of the component layers to be taken out into the ambient air.

Further, for the purpose of forming the bonding pad in a prescribed shape, the lift-off method which has been known long heretofore may be adopted.

When the bonding pad is formed on the current diffusion layer, the deposition of the bonding pad is preferred to be preceded by a treatment which is given to the current diffusion layer for the purpose of cleaning the surface thereof. For the purpose of this, treatment, the irradiation with ultraviolet light and the heat treatment may be adopted besides the wet cleaning using an acid or an alkali and the dry cleaning resorting to exposure to a sputter or a reactive gas. Among other methods mentioned above, the cleaning by the use of a reactive gas is advantageous and the method resorting to the irradiation with ultraviolet light and using ozone proves favorable because it provides facility and promises an effect.

The material of the current diffusion layer is a metal of high electric conductivity, such as a metal selected from the group consisting of gold, silver and copper, or an alloy containing at least one of the metals enumerated above, for example. Gold proves most favorable because it shows a high light transmission when it is formed into a thin film.

In this case, the thickness of the current diffusion layer is preferably in the range of 1 to 20 nm. If the thickness falls short of 1 nm, the shortage will prevent the effect of electric current diffusion from being manifested fully satisfactorily. If the thickness exceeds 20 nm, the overage will possibly result in markedly lowering the ability of the current diffusion layer to transmit light and degrading the light emitting output. The thickness is more preferably 10 nm or less. By fixing this thickness in the range of 3 to 6 nm, the current diffusion layer is enabled to improve best the balance between the ability to transmit light and the effect of electric current diffusion and, when joined with the contact metal layer, allow the entire surface on the positive electrode to emit light and acquire light emission of high output.

The material of the current diffusion layer may be an oxide having high electric conductivity, such as an oxide selected from the group consisting of ITO and zinc oxide or a material containing at least one of such oxides, for example. In the oxides mentioned above, ITO proves most favorable because of high electric conductivity.

In this case, the thickness of the current diffusion layer is preferably in the range of 1 to 5000 nm. If this thickness falls short of 1 nm, the shortage will result in preventing the effect of electric current diffusion from being fully manifested. If the thickness exceeds 5000 nm, the overage will possibly result in markedly lowering the ability of the current diffusion layer to transmit light and degrading the output of light emission. By fixing this thickness in the range of 100 to 1000 nm, the current diffusion layer is enabled to improve best the balance between the ability to transmit light and the effect of electric current diffusion and, when joined with the contact metal layer, allow the entire surface on the positive electrode to emit light and acquire light emission of high output.

As regards the performance which the contact metal layer is required to possess, the small contact resistance between this layer and the p-layer constitutes an essential factor. Further, the face-up mount type light-emitting device in which the light from the light-emitting layer is taken out from the electrode face side is required to possess an excellent ability to transmit light.

As the materials available for the contact metal layer, platinum group metals, such as platinum (Pt), ruthenium (Ru), osmium (Os), rhodium (Rh), iridium (Ir) and palladium (Pd), prove favorable from the viewpoint of the contact resistance with the p-layer. Among other materials enumerated above, Pt proves particularly advantageous because it possesses a high work function and an ability to acquire excellent ohmic contact in an unheated state with a p-type GaN compound semiconductor layer of comparatively high resistance which has not undergone a heat treatment at a high temperature.

When the contact metal layer is formed of a platinum group metal, it is necessary from the viewpoint of the ability to transmit light that the thickness thereof be extremely small. The thickness of the contact metal layer is preferably in the range of 0.1 to 7.5 nm. If this thickness falls short of 0.1 nm, the shortage will render it difficult to obtain a stable thin film. If the thickness exceeds 7.5 nm, the overage will result in degrading the ability to transmit light. The thickness is more preferably 5 nm or less. It is particularly preferably in the range of 0.5 to 2.5 nm in consideration of the degradation of the ability to transmit light due to the subsequent deposition of the current diffusion layer and the stability of the formation of a film.

When the current diffusion layer is absent and the contact metal layer has a small thickness, the contact metal layer suffers the electric resistance thereof in the plane direction to increase and the pad layer, namely an electric current injecting part, in combination with the p layer of comparatively high resistance, is barely allowed to diffuse electric current in the peripheral part thereof. As a result, the pattern of light emission is rendered uneven and the output of light emission is lowered.

Thus, by disposing on the contact metal layer the current diffusion layer formed of a highly electroconductive metal thin film or metal oxide having a high coefficient of light transmission as a means to compensate for the electric current diffusing property of the contact metal layer, it is made possible to uniformly widen the electric current without appreciably impairing the low contact resistance or the light transmission of the platinum group metal and consequently enable acquisition of a light-emitting device of high output of light emission.

At this time, the current diffusion layer has no meaning of its own entity unless the magnitude of resistivity in the plane of the electrode is smaller than the contact metal. The magnitude of the resistivity is decided by the magnitude of the resistance inherent in the material and the thickness of the film to be deposited thereon. In short, when a metal is used, the current diffusion layer can be formed in a small thickness because the metal has a small coefficient of resistance. When an electroconductive metal oxide is used, the current diffusion layer must be formed in a large thickness because the metal oxide has a large coefficient of resistance than the metal.

The method for forming the contact metal layer and the current diffusion layer does not need to be particularly restricted but may be selected from among known methods, such as the vacuum deposition method and the sputtering method.

The transparent electrode of this invention can be used without any restriction for the heretofore known gallium nitride-based compound semiconductor light-emitting device which, as illustrated in FIG. 1, has a gallium nitride-based compound semiconductor deposited on a substrate through a buffer layer and has an n-type semiconductor layer, a light-emitting layer and a p-type semiconductor layer formed thereon.

For the substrate, any of the known substrate materials including oxide single crystals, such as sapphire single crystal ($Al_2O_3$: A face, C face, M face and R face), spinel single crystal ($MgAl_2O_4$), ZnO single crystal, $LiAlO_2$ single crystal, $LiGaO_2$ single crystal and MgO single crystal, Si single crystal, SiC single crystal, GaAs single crystal, AlN single crystal and GaN single crystal, and boride single crystals, such as $ZrB_2$ single crystal can be used without any restriction. Incidentally, the plane direction of the substrate is not particularly restricted. The substrate may be a just substrate or a substrate provided with an off angle.

The n-type semiconductor layers, light-emitting layers and p-type semiconductor layers are widely known in various structures. These layers in such universally known structures may be used herein without any restriction. While an ordinary concentration is used particularly for the carrier concentration in the p-type semiconductor layer, the transparent electrode of this invention can be applied to a p-type semiconductor layer having a comparatively low carrier concentration approximating to $1\times10^{17}$ cm$^{-3}$.

As the gallium nitride-based compound semiconductors available for forming these layers, the semiconductors of varying compositions which are represented by the general formula, $Al_xIn_yGa_{1-x-y}N$ ($0\leq x<1$, $0\leq y<1$ and $0\leq x+y<1$), are universally known. For the gallium nitride-based compound semiconductors which form the n-type semiconductor layer, the light-emitting layer and the p-type semiconductor contemplated by this invention, the semiconductors of varying compositions which are represented by the general formula, $Al_xIn_yGa_{1-x-y}N$ ($0\leq x<1$, $0\leq y<1$ and $0\leq x+y<1$), can be used without any restriction.

The method for growing these gallium nitride-based compound semiconductors does not need to be particularly restricted. All the methods, such as HVPE (hydride vapor phase epitaxy) and MBE (molecular beam epitaxy), which are known to grow Group III nitride semiconductors may be applied. A preferred method of growth is the MOCVD method from the viewpoint of the film thickness controlling property and the mass-producing property. The MOCVD method uses hydrogen ($H_2$) or nitrogen ($N_2$) as a carrier gas, trimethyl gallium (TMG) or triethyl gallium (TEG) as a Ga source which is a Group III raw material, trimethyl aluminum (TMA) or triethyl aluminum (TEA) as an Al source, trimethyl indium (TMI) or triethyl indium (TEI) as an In source and ammonia ($NH_3$) or hydrazine ($N_2H_4$) as an N source which is a Group V raw material. As the dopant, monosilane ($SiH_4$) or disilane ($Si_2H_6$) is used as an Si raw material and germane ($GeH_4$) is used as a Ge raw material in the n-type semiconductor, and biscyclopentadienyl magnesium ($Cp_2Mg$) or bis-ethylcyclopentadienyl magnesium (($EtCp)_2Mg$) as a Mg raw material in the p-type semiconductor.

For the purpose of forming a negative electrode contiguous to the n-type semiconductor layer of the gallium nitride-based compound semiconductor having the n-type semiconductor layer, the light-emitting layer, and the p-type semiconductor layer sequentially stacked on the substrate, the n-type semiconductor layer is exposed by partially removing the light-emitting layer and the p-type semiconductor layer. Thereafter, the transparent electrode of this invention is formed on the remaining p-type semiconductor layer and a negative electrode is formed on the exposed n-type semiconductor layer. As the negative electrode, negative electrodes of various compositions and structures have been universally known and any of them may be used without any particular restriction.

When the light-emitting device is fabricated by using this invention, the produced device is enabled to possess a low operation voltage. Further, electronic devices, such as portable telephones, displays and panels, which incorporate chips produced by this procedure and mechanical devices, such as automobiles, computers and game machines, which incorporate such electronic devices are enabled to be operated with low electric power and are enabled to materialize high characteristic properties. Particularly in battery-operated devices, such as portable telephones, portable game machines, toys, digital cameras and automobile parts, the effect of reducing electric power and the elongation of available time can be materialized.

Now, this invention will be described more specifically below with reference to examples. This invention, however, is not limited to these examples.

EXAMPLE 1

Figure 2:
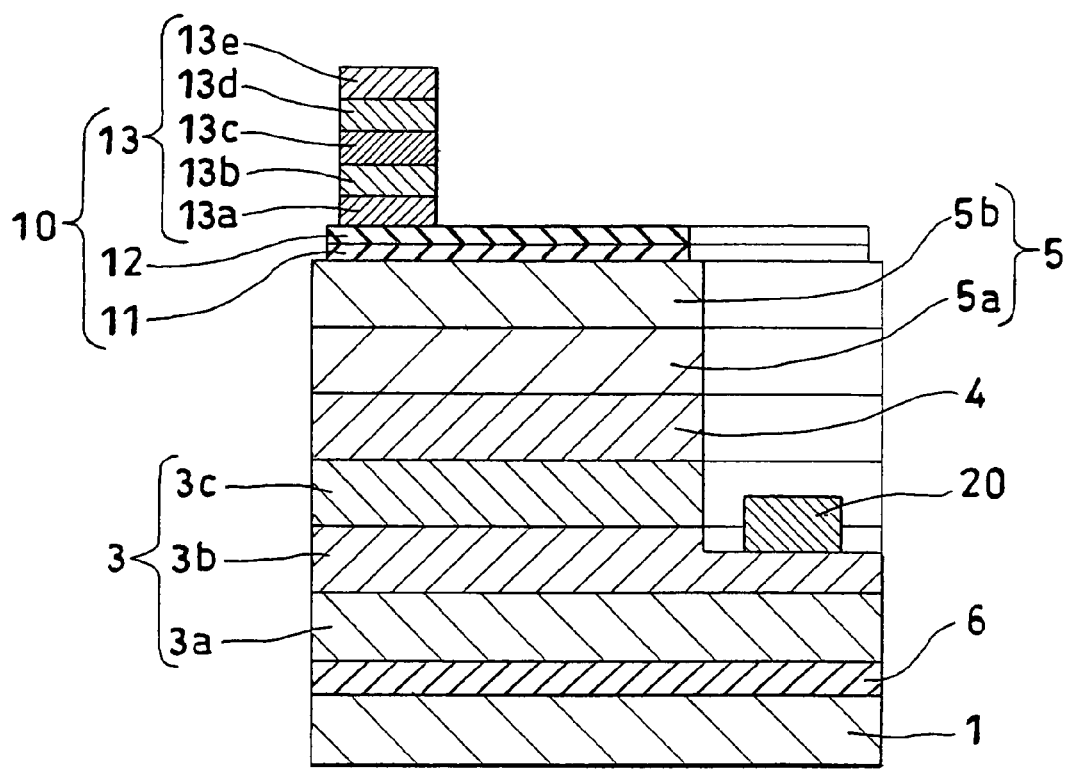
FIG. 2 is a schematic view illustrating the cross section of a gallium nitride-based compound semiconductor light-emitting device provided with a transparent electrode of this invention fabricated in Example 1.
Figure 3:
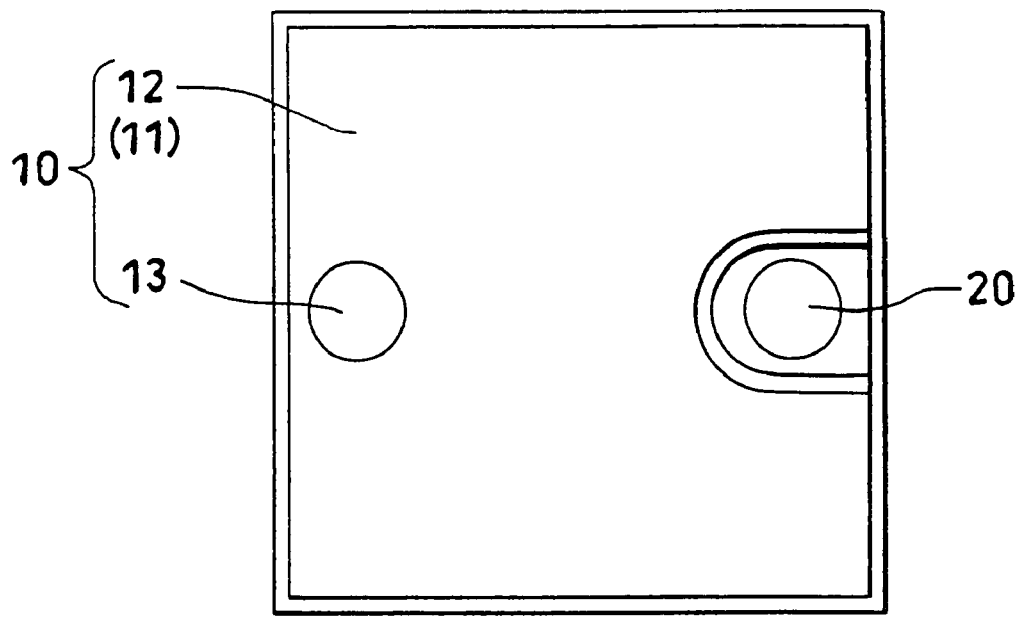
FIG. 3 is a schematic view illustrating the plan view of a gallium nitride-based compound semiconductor light-emitting device provided with a transparent electrode of this invention fabricated in Example 1.

FIG. 2 is a schematic view illustrating the cross section of a gallium nitride-based compound semiconductor light-emitting device fabricated in this example and FIG. 3 is a schematic view illustrating the plan view thereof. On a substrate 1 made of sapphire, an under layer 3a made of undoped GaN and measuring 8 μm in thickness, an Si-doped n-type GaN contact layer 3b measuring 2 μm in thickness, an n-type $In_{0.1}Ga_{0.9}N$ cladding layer 3c measuring 250 nm in thickness, a Si-doped GaN barrier layer measuring 16 nm and an $In_{0.2}Ga_{0.8}N$ well layer measuring 1.5 nm in thickness were stacked through a buffer layer 6 made of AlN up to five repetitions. Finally, a positive electrode 10 of this invention formed of a bonding pad layer 13 of a five-layer structure consisting of a Pt contact metal layer 11 measuring 1.5 nm in thickness, an Au current diffusion layer 12 measuring 5 nm in thickness, an Au layer 13a measuring 50 nm in thickness, a Ti layer 13b measuring 20 nm in thickness, an Al layer 13c measuring 10 nm in thickness, a Ti layer 13d measuring 100 nm in thickness and an Au layer 13e measuring 200 nm in thickness was formed on the p-type AlGaN contact layer of a gallium nitride-based compound semiconductor resulting from sequentially stacking a light-emitting layer 4 of a multiple quantum well structure provided with a barrier layer, an Mg-doped p-type $Al_{0.07}Ga_{0.93}N$ cladding layer 5a measuring 0.01 μm in thickness, and an Mg-doped p-type $Al_{0.02}Ga_{0.98}N$ contact layer 5b measuring 0.15 μm in thickness. Of the five layers forming the bonding pad, the Au layer 13a of 50 nm constituted the first layer, the Ti layer 13b of 50 nm the second layer, the Al layer 13c of 10 nm the barrier layer, the Ti layer 13d of 100 nm the layer for preventing Al and Au from being alloyed and the Au layer 13e of 200 nm the uppermost layer. Then, a negative electrode 20 of a Ti/Au two-layer structure was formed on the n-type GaN contact layer to give rise to a light-emitting device having a fetching surface on the semiconductor layer side. The positive electrode and the negative electrode were shaped as illustrated in FIG. 3.

In this structure, the carrier concentration in the n-type GaN contact layer was $1\times10^{19}$ cm$^{-3}$, the amount of Si doped in the GaN barrier layer was $1\times10^{18}$ cm$^{-3}$, the carrier concentration in the p-type GaN contact layer was $5\times10^{18}$ cm$^{-3}$, and the amount of Mg doped in the p-type AlGaN cladding layer was $5\times10^{19}$ cm$^3$.

The gallium nitride-based compound semiconductor layer was deposited by the MOCVD method under the ordinary conditions well known in the pertinent technical field. Then, the positive electrode and the negative electrode were formed by the following procedure.

In the beginning, the part of the n-type GaN contact layer for forming the negative electrode by the reactive ion etching method was exposed by the following procedure.

First, an etching mask was formed on the p-type semiconductor layer. This formation was carried out by the following procedure. The resist was uniformly applied to the whole surface, and the resist was removed by the known technique of lithography from the region one margin larger than the region of the positive electrode. The resultant layer was set in a vacuum deposition device and Ni and Ti were deposited in respective approximate thicknesses of 50 nm and 300 nm by the electron beam method under pressure of $4\times10^{-4}$ Pa or less. Thereafter, the metal films outside the region of the positive electrode were removed together with the resist by the lift-off technique.

Then, a substrate for depositing a semiconductor was mounted on the electrode inside the etching chamber of a reactive ion etching device. The substrate, with the etching chamber vacuumed to $10^{-4}$ Pa and $Cl_2$ supplied as an etching gas, was etched till the n-type GaN contact layer was exposed. The etched substrate was withdrawn from the reactive ion etching device and was denuded of the etching mask with sulfuric acid and hydrofluoric acid.

Then, exclusively in the region for forming the positive electrode on the p-type GaN contact layer, a contact metal layer of Pt and a current diffusion layer of Au were formed by using the known photolithography technique and lift-off technique. The formation of the contact metal layer and the current diffusion layer was implemented by first placing in the vacuum deposition device the substrate having the gallium nitride-based compound semiconductor layer deposited thereon and depositing first Pt in a thickness of 1.5 nm and then Au in a thickness of 5 nm on the p-type GaN contact layer. Subsequently, the resultant stacked structure was withdrawn from the vacuum chamber and processed by the universally known procedure generally called a lift-off technique. By the same procedure, the first layer 13*a* of Au, the second layer 13*b* of Ti, the barrier layer 13*c* of Al, the layer 13*d* of Ti for preventing Al and Au from being alloyed and the fifth layer 13*e* of Au were sequentially deposited on part of the current diffusion layer to give rise to the bonding pad layer 13. In this case, the region destined to form the pad electrode was cleaned by being irradiated with the ultraviolet light and swept with an ozone gas.

The positive electrode contemplated by this invention was formed on the p-type GaN contact layer as described above.

The positive electrode formed by this method showed transparency and possessed light transmission of 60% in the wavelength region of 470 nm. Incidentally, the light transmission was measured with a sample obtained by forming the contact metal layer and the current diffusion layer in a size for the measurement of light transmission.

Then, the negative electrode was formed on the exposed n-type GaN contact layer in accordance with the following procedure. The resist was uniformly applied to the whole surface and it was removed by the known lithography technique from the part for forming the negative electrode on the exposed n-type GaN contact layer and the negative electrode consisting of Ti of a thickness of 100 nm and Au of a thickness of 200 nm sequentially from the semiconductor layer side was formed by the vacuum deposition method usually employed in the situation. Thereafter, the resist was removed by the known method.

The wafer having the positive electrode and the negative electrode formed thereon as described above was shaved and polished on the second surface of the substrate till the thickness of the substrate decreased to 80 μm. After mark-off lines were inscribed in the wafer from the semiconductor deposited layer side by the use of a laser scriber, the wafer was severed under pressure into chips each of the square of 350 μm. When these chips were tested for voltage in the forward direction at 20 mA of an electric current applied by electrification with a probe coil, the voltage was found to be 2.9 V.

Thereafter, the chips were mounted on a TO-18 can package and tested for the output of light emission by the use of an LED tester. They showed an output of light emission of 5 mW at an applied electric current of 20 mA. By the distribution of light emission on the light-emitting surface, it could be confirmed that the whole surface on the positive electrode was emitting light.

COMPARATIVE EXAMPLE 1

Figure 4:
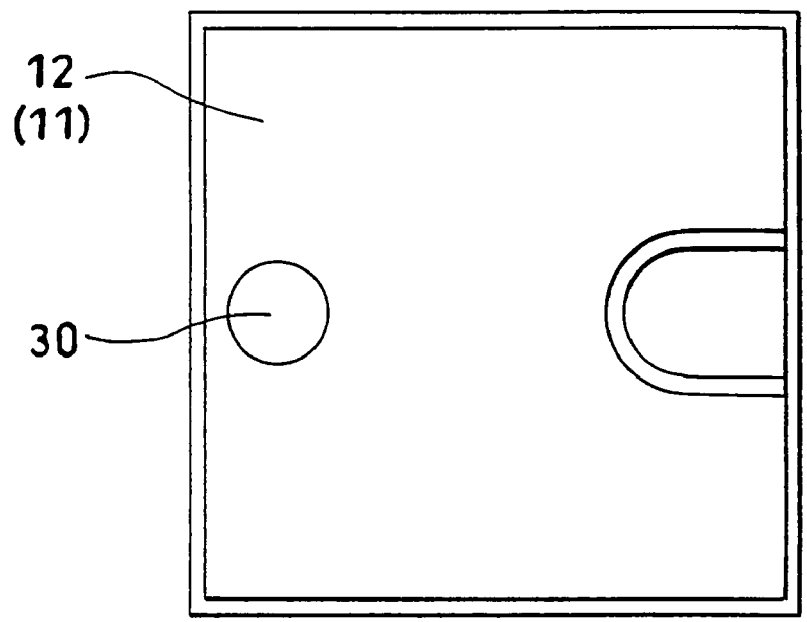
FIG. 4 is a schematic view illustrating the plan view of a transparent electrode part containing a cut-off portion in a transparent electrode fabricated in Comparative Example 1.
Figure 5:
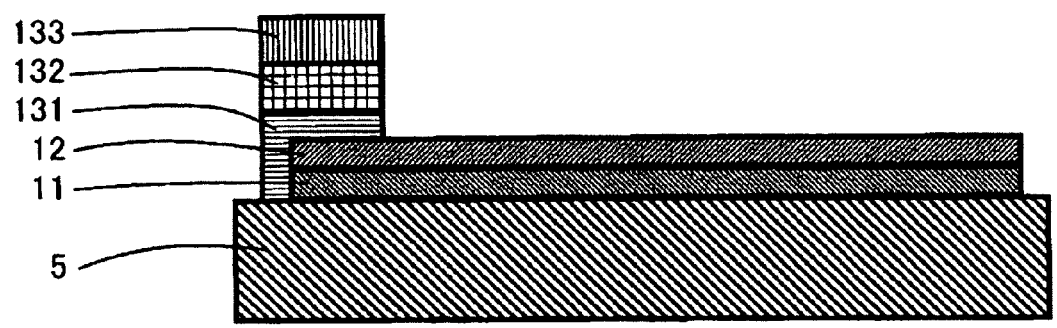
FIG. 5 is a schematic view illustrating the bonding pad having an area of contact with the p-type semiconductor layer that is 10% or less of this invention.
Figure 6:
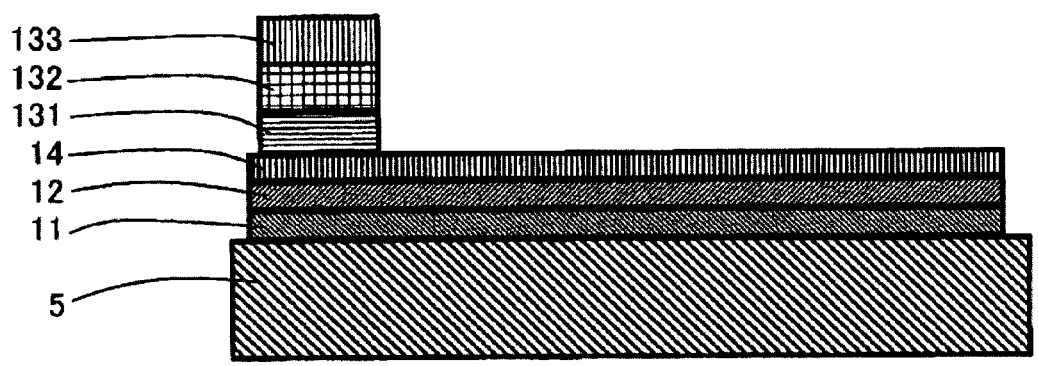
FIG. 6 is a schematic view illustrating the current diffusion layer having an uppermost layer covered with a metal layer 14 of this invention.

A bonding pad having a first layer made of Ti was formed by imparting a cut-off portion 30 to part of a transparent electrode and causing a p-type semiconductor to contact the cut-off portion directly. The transparent electrode provided with the cut-off portion 30 and used in this comparative example was shaped as illustrated in FIG. 4. A gallium nitride-based compound semiconductor light-emitting device was fabricated by following the procedure of Example 1 while forming the transparent electrode as described above. When this light-emitting device was tested similarly for the voltage in the forward direction, the voltage was found to be 3.3 V, which indicates an increase from the sample of Example 1.

The cause for this increase may be explained by a supposition that the formation of the bonding pad in the cut-off portion not destined to form a transparent electrode resulted in elevating the contact resistance of this part and consequently decreasing the area capable of obtaining excellent contact resistance.

EXAMPLE 2

In Example 2, an electrode was formed in the following structure with a substrate having the same stacked structure as in Example 1.

Specifically, a positive electrode 10 of this invention was formed of a bonding pad 13 in a five-layer structure consisting of a Pt contact metal layer 11 measuring 1.5 nm in thickness, an ITO current diffusion layer 12 measuring 100 nm in thickness and a Cr layer 13*a* measuring 50 nm in thickness, a Ti layer 13*b* measuring 20 nm in thickness, an Al layer 13*c* measuring 10 nm in thickness, a Ti layer 13*d* measuring 100 nm in thickness and an Au layer 13*e* measuring 200 nm in thickness. In the five layers which formed the bonding pad, the Cr layer 13*a* measuring 50 nm in thickness constituted a first layer, the Ti layer 13*b* measuring 20 nm in thickness a second layer, the Al layer 13*c* measuring 10 nm in thickness a barrier layer, the Ti layer 13*d* measuring 100 nm in thickness a layer for preventing Al and Au from being alloyed, and the Au layer 13*e* measuring 200 nm in thickness the uppermost layer. Then, a negative electrode 20 having a Ti/Au two-layer structure was formed on the n-type GaN contact layer to give rise to a light-emitting device having a light fetching surface on the semiconductor layer side. The positive electrode and the negative electrode were shaped in the same forms as in Example 1.

A gallium nitride-based compound semiconductor light-emitting device was fabricated by following the procedure of Example 1 while forming the positive electrode and the negative electrode as described above. When this light-emitting device was tested similarly for the voltage in the forward direction, the voltage was found to be 2.9 V, i.e. a magnitude identical with that of Example 1.

Thereafter, the chips were mounted on a TO-18 can package and tested for the output of light emission by the use of an LED tester. They showed an output of light emission of 5 mW at an applied electric current of 20 mA similarly to Example 1. By the distribution of light emission on the light-emitting surface, it could be confirmed that the whole surface on the positive electrode was emitting light.

Though the current diffusion layer was made of ITO in Example 2, a thin layer of metal may be deposited thereon with the object of enhancing the adhesive property. A layer of tin or indium, for example, may be used for this purpose.

INDUSTRIAL APPLICABILITY

The electrode provided by this invention for use in the gallium nitride-based compound semiconductor light-emitting device is useful as a positive electrode for a transparent gallium nitride-based compound semiconductor light-emitting device.

The invention claimed is:

1. A transparent electrode for a gallium nitride-based compound semiconductor light-emitting device having a p-type semiconductor layer, wherein the transparent electrode comprises a contact metal layer formed by ohmic contact on the p-type semiconductor layer, a current diffusion layer formed on the contact metal layer and having a lower magnitude of resistivity on a plane of the transparent electrode than the contact metal, and a bonding pad formed on the current diffusion layer; wherein the transparent electrode contains a layer of an electroconductive oxide; and wherein the contact metal layer is formed of a platinum group metal.

2. A transparent electrode according to claim 1, wherein the bonding pad has an area of 90% or more held in direct contact with the current diffusion layer.

3. A transparent electrode according to claim 1, wherein the bonding pad has an area of direct contact with the p-type semiconductor layer that is 10% or less.

4. A transparent electrode according to claim 1, wherein the bonding pad avoids direct contact with the p-type semiconductor layer.

5. A transparent electrode according to claim 1, wherein the current diffusion layer has an uppermost layer covered with a metal layer formed of tin and/or indium.

6. A transparent electrode according to claim 1, wherein the contact metal layer is formed of platinum.

7. A transparent electrode according to claim 1, wherein the contact metal layer has a thickness in a range of 0.1 to 7.5 nm.

8. A transparent electrode according to claim 1, wherein the contact metal layer has a thickness of 5 nm or less.

9. A transparent electrode according to claim 1, wherein the contact metal layer has a thickness in a range of 0.5 to 2.5 nm.

10. A transparent electrode according to claim 1, wherein the current diffusion layer is formed of a metal selected from the group consisting of gold, silver and copper or an alloy containing at least one of these.

11. A transparent electrode according to claim 1, wherein the current diffusion layer is formed of gold.

12. A transparent electrode according to claim 1, wherein the current diffusion layer has a thickness in a range of 1 to 20 nm.

13. A transparent electrode according to claim 1, wherein the current diffusion layer has a thickness of 10 nm or less.

14. A transparent electrode according to claim 1, wherein the current diffusion layer has a thickness in a range of 3 to 6 nm.

15. A transparent electrode according to claim 1, wherein the bonding pad contains a first layer contacting the current diffusion layer, and the first layer is formed of at least one metal selected from the group consisting of Ti, Al, Au, and Cr or an alloy thereof.

16. A transparent electrode according to claim 15, wherein the first layer of the bonding pad has a thickness in a range of 20 to 3000 nm.

17. A transparent electrode according to claim 15, wherein the bonding pad contains a second layer formed on the first layer of the bonding pad, and the second layer is formed of at least one metal selected from Ti and Cr or an alloy thereof.

18. A transparent electrode according to claim 17, wherein the second layer of the bonding pad has a thickness in a range of 20 to 3000 nm.

19. A transparent electrode according to claim 1, wherein the bonding pad has an uppermost layer formed of Au.

20. A light-emitting device using the transparent electrode set forth in claim 1.

* * * * *